(12) United States Patent
Park et al.

(10) Patent No.: US 11,262,380 B2
(45) Date of Patent: Mar. 1, 2022

(54) WAFER PROBER

(71) Applicant: SEMICS INC., Gwangju-si (KR)

(72) Inventors: Nam Woo Park, Seoul (KR); Ki Tack Park, Suwon-si (KR)

(73) Assignee: SEMICS INC., Gwangju-si (KR)

( * ) Notice: Subject to any disclaimer, the term of this patent is extended or adjusted under 35 U.S.C. 154(b) by 24 days.

(21) Appl. No.: 16/960,635

(22) PCT Filed: Jan. 15, 2019

(86) PCT No.: PCT/KR2019/000573
§ 371 (c)(1),
(2) Date: Jul. 8, 2020

(87) PCT Pub. No.: WO2019/143091
PCT Pub. Date: Jul. 25, 2019

(65) Prior Publication Data
US 2020/0348335 A1    Nov. 5, 2020

(30) Foreign Application Priority Data

Jan. 19, 2018 (KR) .................. 10-2018-0007106
Jan. 15, 2019 (KR) .................. 10-2019-0005013

(51) Int. Cl.
*G01R 31/28* (2006.01)
*G01R 1/04* (2006.01)
*H01L 21/687* (2006.01)

(52) U.S. Cl.
CPC ........... *G01R 1/04* (2013.01); *G01R 31/2831* (2013.01); *H01L 21/68742* (2013.01)

(58) Field of Classification Search
CPC .............. G01R 1/0491; G01R 31/2887; G01R 31/2889
See application file for complete search history.

(56) References Cited

U.S. PATENT DOCUMENTS 6,140,828 A * 10/2000 Lino .................. G01R 31/2887
324/750.22
2004/0227536 A1* 11/2004 Sugiyama .......... G01R 1/06705
324/750.03
(Continued)

FOREIGN PATENT DOCUMENTS

JP    2000249185    9/2000
JP    2004291156    10/2004
(Continued)

OTHER PUBLICATIONS

International Search Report—PCT/KR2019/000573 dated May 10, 2019.

*Primary Examiner* — Tung X Nguyen
(74) *Attorney, Agent, or Firm* — Cantor Colburn LLP

(57) ABSTRACT

Provided is a wafer prober. The wafer probing stage of the wafer prober includes: a lower plate; a plurality of lifting pillars mounted on an upper surface of the lower plate; and an upper plate mounted on upper ends of the plurality of lifting pillars, wherein the plurality of lifting pillars are located between the upper plate and the lower plate and ends of the lifting pillars are configured to lift up and down in a vertical direction, and wherein a height and a slope of the upper plate are adjusted according to heights of the lifting pillars. The wafer probing stage can adjust a height of the chuck arranged on the upper plate and a slope or flatness of the chuck by adjusting a height of each lifting pillar according to a weight applied to each lifting pillar.

15 Claims, 7 Drawing Sheets

(56) References Cited

U.S. PATENT DOCUMENTS

| | | |
|---|---|---|
| 2005/0127898 A1 | 6/2005 | Yoshioka |
| 2011/0227602 A1* | 9/2011 | Schmidt ............ G01R 31/2886 |
| | | 324/762.05 |

FOREIGN PATENT DOCUMENTS

| | | |
|---|---|---|
| JP | 2006165523 | 6/2006 |
| JP | 2010522431 | 7/2010 |
| JP | 2012051054 | 3/2012 |
| KR | 20110138491 | 12/2011 |
| KR | 101794602 | 11/2017 |

\* cited by examiner (a)　　　　　　(b)　　　　　　(c)

WAFER PROBER

TECHNICAL FIELD

The present invention relates to a wafer prober, and more specifically, to a wafer prober in which a plurality of lifting pillars independently driven are arranged to be spaced from each other under the chuck and the height of each of the lifting pillars are adjusted independently, so that the height of the chuck and the slope of the chuck can be adjusted, and as a result, the contact surface between a wafer placed on the top of the chuck and a probe card in contact with the wafer can be allowed to retain a flat posture.

BACKGROUND ART

A wafer prober, which is a semiconductor inspection equipment, is a device that checks the presence or absence of defects by inspecting electrical characteristics of semiconductor devices fabricated on a wafer immediately before entering a post-process for the wafer having all semiconductor pre-processes completed.

In general, the wafer prober includes a stage which is capable of driving in vertical and horizontal directions, a chuck which is mounted on the stage and in which a wafer is mounted on an upper surface, an electrical test device which inspects the wafer, and a probe card which is connected to the test device to be in contact with the wafer.

The probes of the probe card range from dozens of pins for electrical inspection to tens of thousands of pins, but these probes are commonly connected to the electrical test device, and the electrical test device is mechanically fastened to the top plate of the base frame. As described above, since the probe card connected to the electrical test device is fastened to the top plate of the fixed frame, the probes of the probe card always retain fixed positions and states. That is, the probe of the probe card is located invariably at the initial fixed position, and the chuck moves up/down and left/right by the movement of the stage to be in contact with the probe.

Meanwhile, the stage arranged on the bottom of the chuck is configured with a horizontal movement mechanism, a vertical movement mechanism, and a rotating mechanism, and serves to move the chuck to an arbitrary point desired. The horizontal movement mechanism is configured with a Y-axis stage that moves the chuck in the front-rear direction and an X-axis stage that moves the chuck in the left-right direction, and the vertical movement mechanism is configured with a Z-axis stage that moves the chuck in the up-down direction.

Each of the horizontal and vertical movement mechanisms in the related art includes a base frame, a Y-axis stage mounted on the base frame, an X-axis stage mounted on the Y-axis stage, and a Z-axis stage mounted on the X-axis stage. That is, the horizontal and vertical movement mechanism in the related art is configured with a structure where a Y-axis stage, an X-axis stage, and a Z-axis stage are sequentially stacked on the base frame.

The vertical movement mechanism in the related art is configured with a Z-axis stage configured with a single lifting pillar, and the height of the chuck is adjusted as the vertical movement mechanism moves up and down in the up-down direction.

On the other hand, in the wafer prober in the related art, in the case of inspecting at the edge of the chuck, the chuck is distorted by being exerted with an eccentric weight. Theoretically, the chuck is necessarily designed to have a structure of no twist and to have rigidity, but in reality, the chuck is distorted by an eccentric weight. In reality, in a state where the probes of the probe card are fixed, the Z-axis stage, which is the vertical movement mechanism, is allowed to move up, so that, when the wafer placed on the chuck on the Z-axis stage is to be brought into contact with the probe, a contact weight is applied to the wafer and the surface of the chuck by the contacting probes. At this time, the chuck cannot be tolerated, and the surface of the chuck is tilted to be distorted, resulting in an undesired slope, and as a result, a portion of the probes of the probe card cannot be properly in contact, resulting in a contact failure.

Like this, as the single Z-axis stage moves up, the eccentric weight is generated and the slope is generated in the chuck by the contact of the probes of the probe card with some regions of the wafer mounted on the chuck. In order to solve this problem, it is necessary to adjust the slope of the chuck so that the chuck retains flatness.

However, as the vertical movement mechanism of the wafer prober in the related art is configured with only the Z-axis stage configured with a single lifting pillar, there is a problem in that it is difficult to adjust the slope of the chuck as well as not providing adequate rigidity for the entire area of the chuck.

SUMMARY OF THE INVENTION

Technical Problem

The present invention for solving the above-described problems is to provide a wafer prober that can not only adjust the height of the chuck, but also easily adjust the slope with respect to the chuck and can provide adequate rigidity over the entire area of the chuck.

Solution to Problems

According to an aspect of the present invention for achieving the above technical problem, there is provided a wafer prober including a chuck for mounting a wafer and a wafer probing stage for moving or rotating the chuck, the wafer probing stage including: a lower plate; a plurality of lifting pillars mounted on an upper surface of the lower plate; and an upper plate mounted on upper ends of the plurality of lifting pillars, wherein each of the plurality of lifting pillars is configured to move up and down between the upper plate and the lower plate, and wherein a height and a slope of the upper plate are adjusted according to heights of the lifting pillars.

In the wafer prober according to the above-described aspect, it is preferable that the plurality of lifting pillars are driven independently of each other, and the plurality of lifting pillars are arranged to be uniformly spaced based on the point of the center of the upper surface of the lower plate.

In the wafer prober according to the above-described aspect, it is preferable that the wafer probing stage further includes a force slope retainment module that changes only the slope of the upper plate without changing the centers of the plurality of lifting pillars.

In the wafer prober according to the above-described aspect, it is preferable that the wafer probing stage further includes: a plurality of weight measurement sensors being provided on the respective lifting pillars and sensing weights applied to the respective lifting pillars; and a preload adjustment module provided between the lower surface of the upper plate and the upper surface of the lifting pillar, wherein the weight measurement sensor is mounted on the top or bottom of the preload adjustment module.

Effects of the Invention

The wafer probing stage of the wafer prober according to the present invention is configured by arranging a plurality of lifting modules spaced apart, and a chuck on which a wafer is mounted is arranged on the lifting modules, so that it is possible to adjust the height of the chuck and it is possible to adjust a slope or flatness with respect to the surface of the chuck.

In addition, the wafer probing stage of the wafer prober according to the present invention drives a plurality of lifting modules independently, and a weight measurement sensor is attached to each lifting module, so that independent weights applied to the lifting modules through the weight measurement sensors can be accurately measured.

Therefore, in the wafer probing stage of the wafer prober according to the present invention, for the first contact between the wafer and the probe card, the entire heights of the plurality of lifting pillars are adjusted and moved to positions registered in advance, and the weight applied to each lifting pillar is detected to measure the slope of the chuck is measured, so that the flatness of the chuck is retained by finely adjusting the height of each of the lifting pillars according to the measured slope.

BEST MODE FOR CARRYING OUT THE INVENTION

In a wafer probing stage of a wafer prober according to the present invention, a plurality of lifting pillars are configured to be arranged spaced from each other based on the point of the center of the chuck and to be able to be driven independently of each other and are configured to detect a weight applied to each lifting pillar, each, so that by adjusting a height of each lifting pillar according to the weight applied to each lifting pillar, it is possible to adjust a height of the chuck and a slope or flatness of the chuck.

Hereinafter, configurations and operations of a wafer prober according to a preferred embodiment of the present invention will be described in detail with reference to the accompanying drawings.

Figure 1:
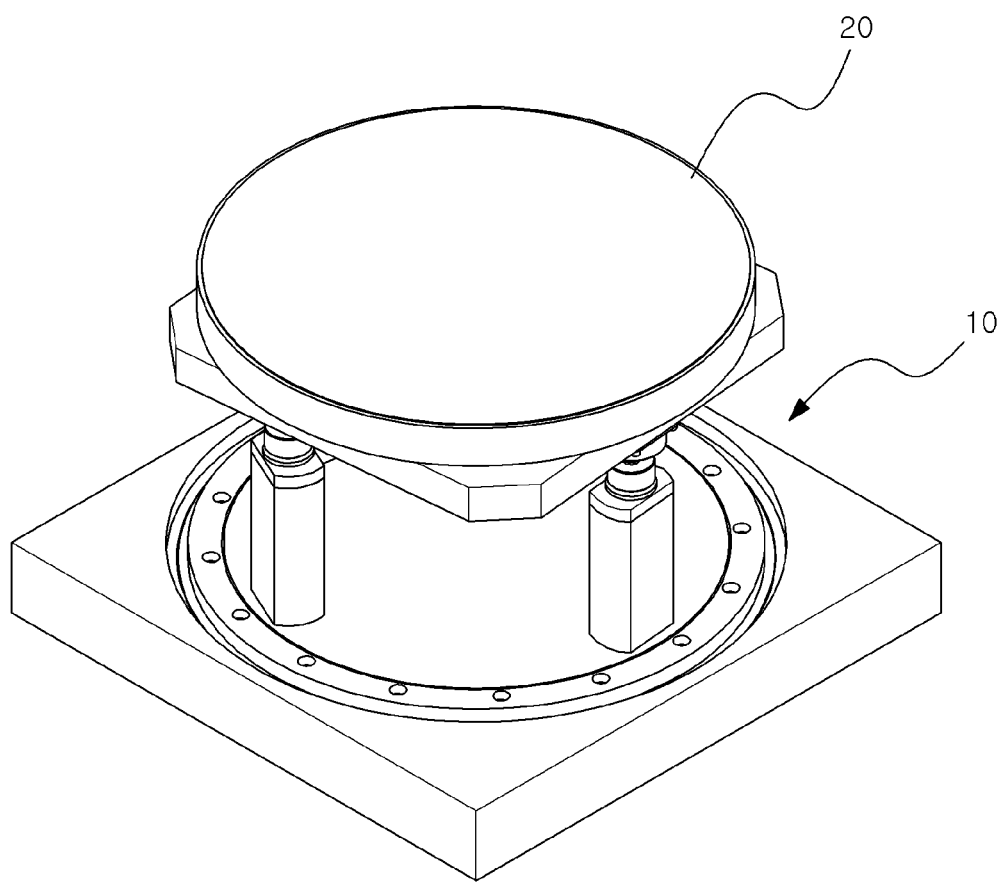
FIG. 1 is a perspective view of a wafer probing stage in a state where a chuck is mounted on a wafer prober according to a preferred embodiment of the present invention.
Figure 2:
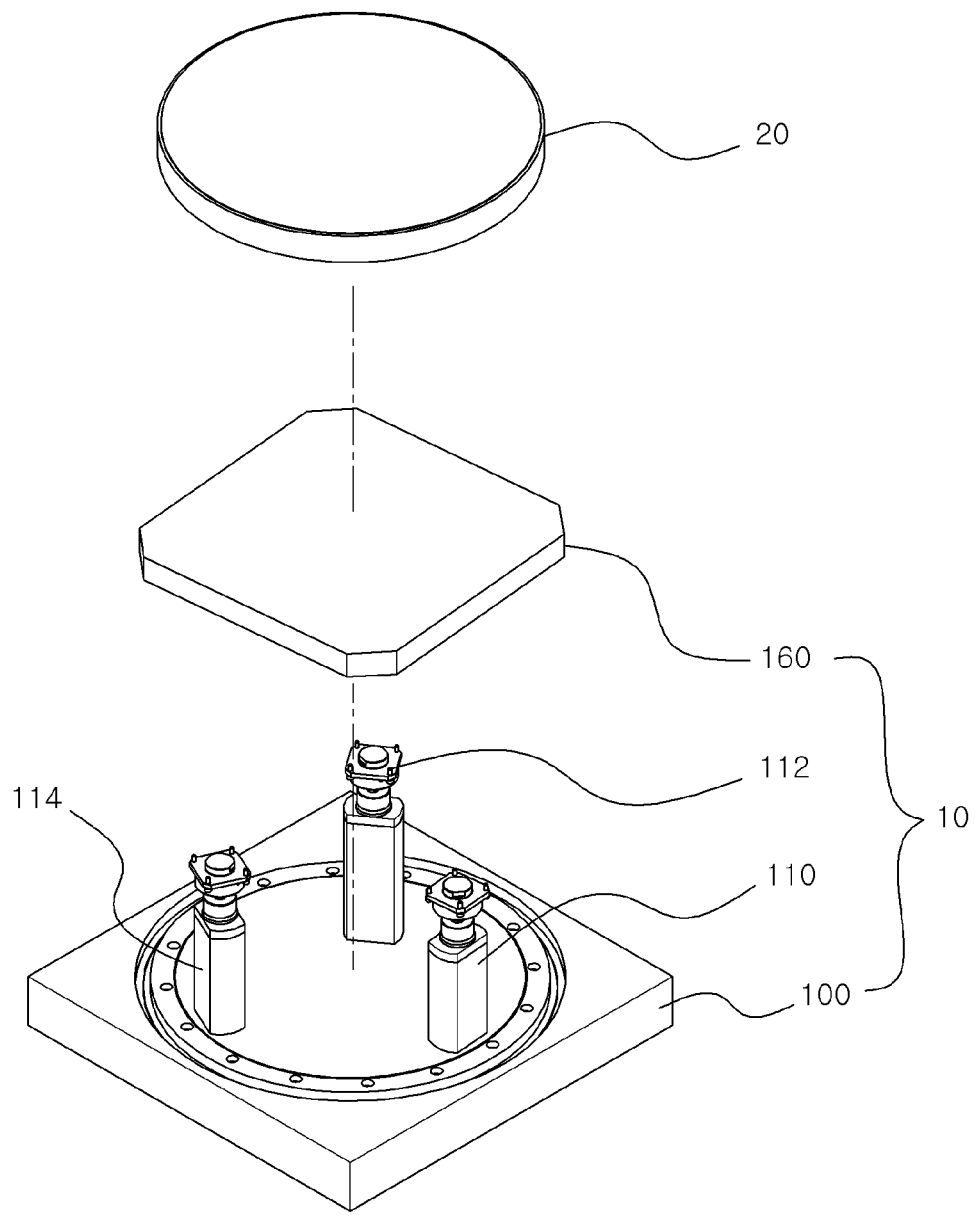
FIG. 2 is an exploded perspective view of a wafer probing stage with the chuck of FIG. 1 mounted.

FIG. 1 is a perspective view of a wafer probing stage 10 in a state where a chuck 20 is mounted on the wafer probing stage in the wafer prober according to the preferred embodiment of the present invention. FIG. 2 is an exploded perspective view of the wafer probing stage in a state where the chuck of FIG. 1 is mounted.

Referring to FIGS. 1 to 2, the wafer probing stage 10 of the wafer prober according to the present embodiment includes a lower plate 100, a plurality of lifting pillars 110, 112, and 114, a plurality of weight measurement sensors 120, 122, and 124, force slope retainment modules 140, 142, and 144, preload adjustment modules 150, 152, and 154, an upper plate 160, and a rotating body module 170.

A chuck for mounting a wafer may be mounted on the upper surface of the upper plate, and the wafer prober according to the present invention can adjust a height of the chuck and a slope of the chuck through driving of the wafer probing stage. In the drawings of the present invention, three lifting pillars are exemplarily illustrated, but this is for convenience of description and is not intended to limit the scope of the present invention.

The lower plate 100 may be mounted on a base frame of the wafer prober or mounted on an XY stage of the wafer prober.

Figure 3:
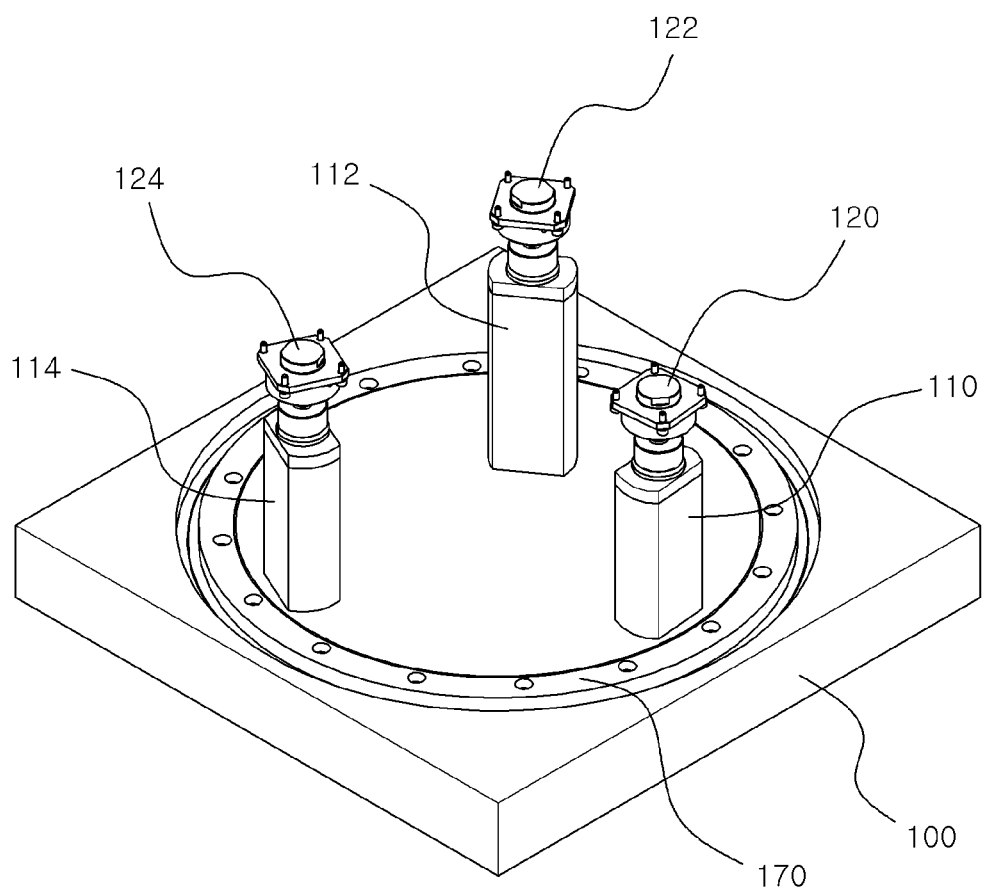
FIG. 3 is a partial perspective view illustrating a state of a lower structure in which a plurality of lifting pillars are mounted on a lower plate in the wafer prober according to the preferred embodiment of the present invention.
Figure 4:
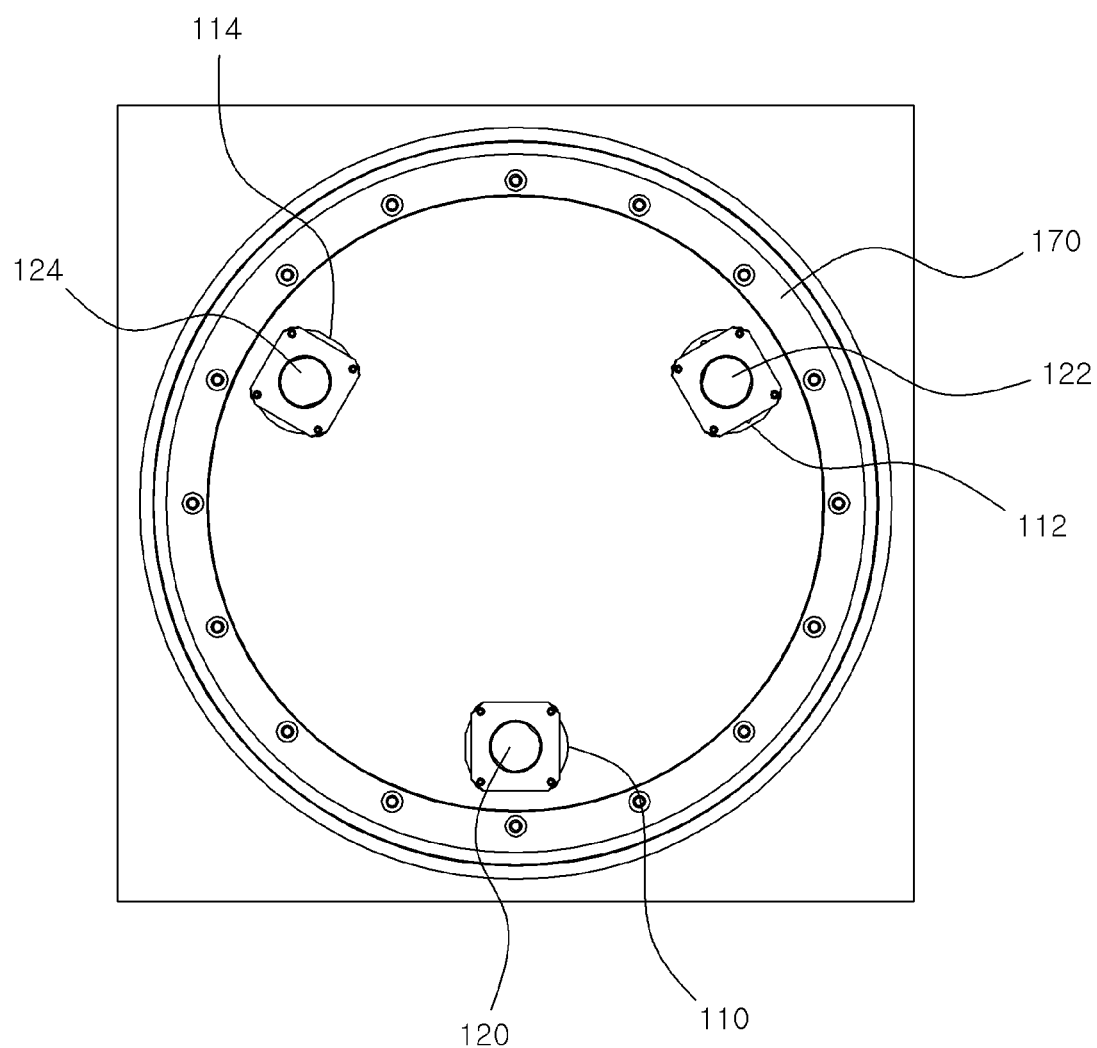
FIG. 4 is a plan view of FIG. 3.

FIG. 3 is a partial perspective view illustrating a state of a lower structure in which a plurality of lifting pillars are mounted on a lower plate in the wafer prober according to the preferred embodiment of the present invention, and FIG. 4 is a plan view of FIG. 3.

Referring to FIGS. 3 to 4, the plurality of lifting pillars 110, 112, and 114 are devices, each of which is configured to be equipped with a step motor or the like inside the lifting pillars to allow the upper ends of the lifting pillars to lift up and down. The plurality of lifting pillars are arranged at a predetermined distance from each other between the upper surface of the lower plate 100 and the lower surface of the upper plate 160.

At least two or more lifting pillars may be provided, and in particular, in a case where three lifting pillars are provided, the lifting pillars may be uniformly spaced based on the point of the center of the upper surface of the lower plate so as to be arranged in a triangle.

Meanwhile, the upper ends of the lifting pillars move in the up-down direction with respect to the lower plate, and the plurality of lifting pillars are driven independently of each other. The height and slope of the upper plate can be adjusted according to the independent up-down movement of the plurality of lifting pillars.

Each of the weight measurement sensors 120, 122, and 124 is configured with a load cell and is provided on each of the upper ends of the lifting pillars to detect and output the weight applied to each lifting pillar.

Figure 5:
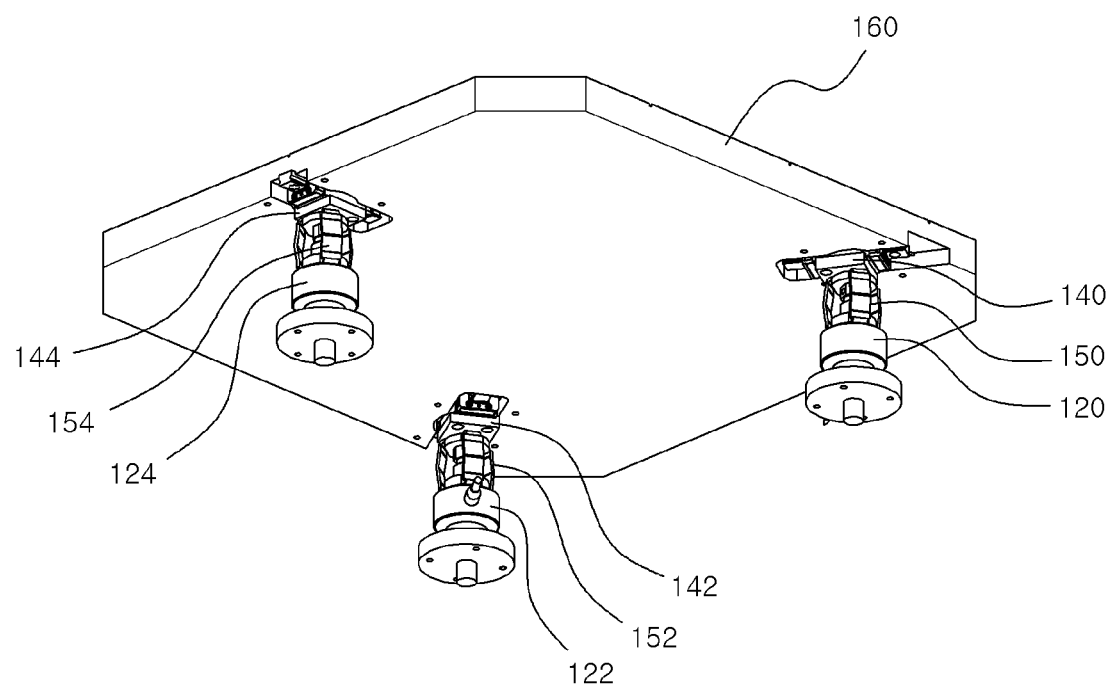
FIG. 5 is a partial perspective view illustrating a state of an upper structure in which a force slope retainment module is provided on an upper plate in the wafer prober according to the preferred embodiment of the present invention.

FIG. 5 is a partial perspective view illustrating a state of an upper structure in which the force slope retainment module is provided on the upper plate in the wafer prober according to the preferred embodiment of the present invention.

Figure 6:
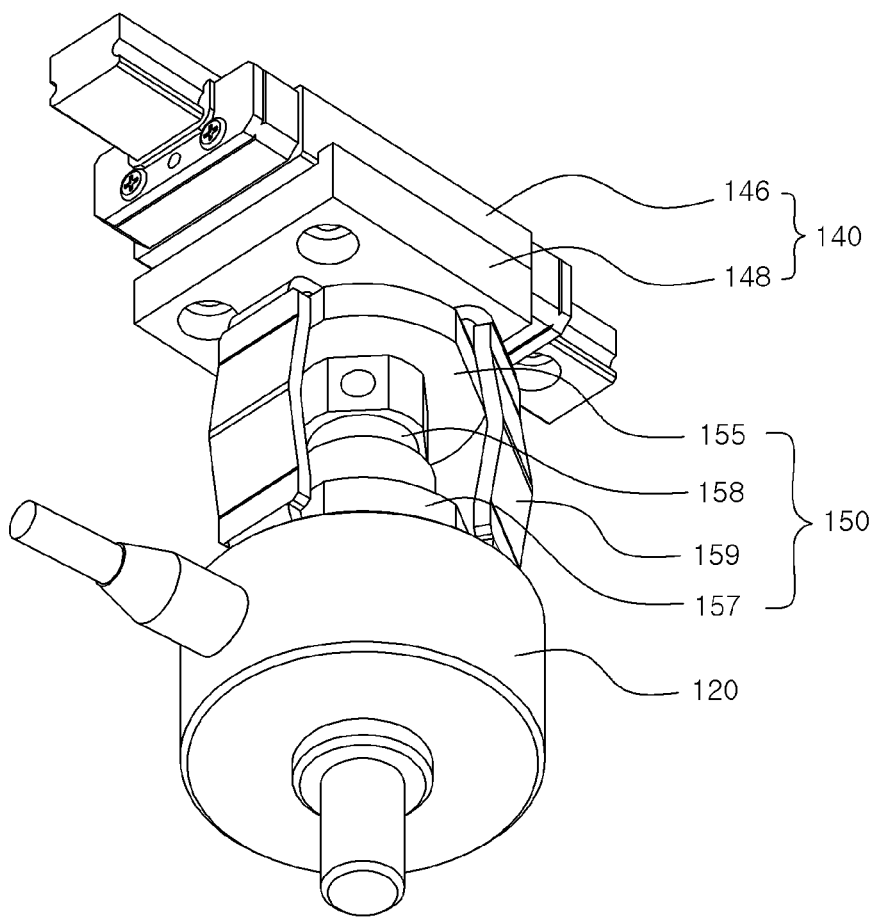
FIG. 6 is a partial perspective view illustrating a state in which a force slope retainment module and a preload adjustment module are provided in the wafer prober according to the preferred embodiment of the present invention.

Referring to FIG. 6, the force slope retainment module 140 is a module that changes only the slope of the upper plate without changing the centers of the plurality of lifting pillars and can be configured with linear motion guides (hereinafter referred to as 'LM guides'). The linear movement guide is configured with LM guide rails 146 and LM guide blocks 148 coupled with the LM guide rails.

The LM guide block 148 is fixedly provided to each of the upper ends of the lifting pillars that abut the lower surface of the upper plate and is coupled with the LM guide rail. The LM guide rail 146 is provided on the lower surface of the upper plate and is coupled with each LM guide block of the lifting pillars. At this time, it is preferable that the longitudinal direction of the LM guide rail is arranged toward the center of the upper plate, so that the LM guide rail horizontally moves toward the center or in the circumferential direction of the upper plate according to the change in the vertical height of the lifting pillar.

By the force slope retainment module having the above-described configuration, when one of the lifting pillars moves in the vertical direction, the LM guide moves in the horizontal direction, and only the slope of the upper plate are changed without changing the centers of the plurality of lifting pillars. It is preferable that the LM guide rail is arranged so that the blocks coupled with the LM guide rail can move toward the center of a triangle formed by a plurality of lifting pillars.

FIG. 6 is a partial perspective view illustrating a state in which a force slope retainment module and a preload adjustment module are provided in the wafer prober according to the preferred embodiment of the present invention.

Referring to FIG. 6, the preload adjustment module 150 is provided between the upper portion of each of weight measurement sensors and the force slope retainment module to apply a preset preload. Meanwhile, the preload adjustment module may be provided under the weight measurement sensor or may be provided over the force slope retainment module.

The preload adjustment module 150 includes a preload adjustment screw 155 which is provided on the bottom of the block; a spherical socket 157 which is provided on an upper portion of the weight measurement sensor 120 and has an upper surface in a spherical shape; a lock nut 158 of which lower surface is provided on the upper surface of the spherical socket and which is coupled with the preload adjustment screw; and a plate spring 159 for preload which is coupled with the lock nut and an outer circumferential surface of the spherical socket, so that the lock nut and the spherical socket exert a spherical contact preload by the plate spring for preload.

The rotator module 170 is a module configured to rotate the lower plate 100 and may be configured by arranging bearings to face the outer circumferential surface of the lower plate 100. In this regard, in the wafer prober in the related art, generally, a rotating unit with respect to the chuck is configured to be narrowly mounted on the top of the Z axis for vertical moving up or is configured to be embedded on the bottom of the Z axis. In such a structure in the related art, when a high weight of about 600 kg or more is applied to the chuck, a large amount of external force is applied to not only the Z-axis, which is a vertical movement mechanism, but also the rotating unit provided on the top or bottom of the Z-axis, so that the rotating unit as well as the Z-axis requires rigidity. In addition, in a case where the shape of a cantilever pin of the probe card is a Pogo pin having a slope of about 15 to 30 degrees, the vertical movement mechanism and the rotating unit of the chuck require rigidity in the vertical and horizontal directions. In view of this point, in the vertical movement mechanism according to the present invention, the rotating body module 170 is arranged on the outside of the plurality of lifting pillars of the wafer probing stage, and the position is arranged in the middle position of the lifting pillar, so that, even if high weight is applied from the top, the vertical movement mechanism has little effect on the rotating body module.

As described above, the rotating body module 170 is arranged on the outside of the lower plate on which the plurality of lifting pillars are mounted, so that there is no height constraint in space, it is possible to manufacture the lifting pillars in a simpler and lighter structure, and it is possible to retain a more solid state so as to exert a large rotating inertia.

As compared to the wafer probing stage in the related art in which the area and volume are large and it is difficult to find the use for the space, in the wafer probing stage of the wafer prober according to the present invention having the above-described configuration, the rest of the area except for the three points formed by the simplified lifting pillars can be utilized for various uses. As a result, by applying the wafer probing stage according to the present invention to the wafer prober, it is possible to significantly reduce the overall size of the wafer prober.

On the other hand, in the wafer probing stage according to the present invention, the plurality of simplified pillars are arranged spaced apart, so that the wafer probing stage has very stable rigidity and can retain a slope posture with respect to the contact force of the probe card applied to the center of the chuck of the wafer prober.

In addition, in the wafer probing stage according to the present invention, the force slope retainment module allows to sense independently the weights of the lifting pillars and can retain independently the postures of the lifting pillars when each of the lifting pillar moves up or down.

Figure 7:
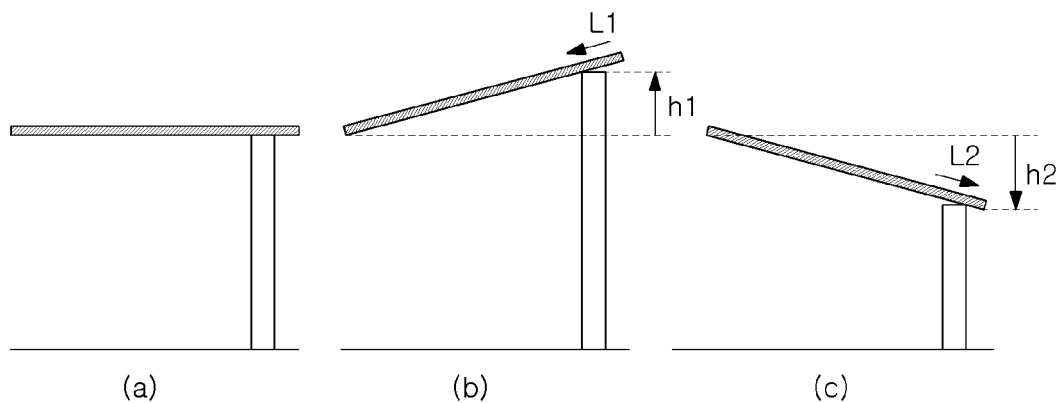
FIGS. 7 and 8 are conceptual diagrams illustrating the movement of the upper plate in the horizontal direction caused by the movement of the lifting pillar in the up-down direction in the wafer prober according to the preferred embodiment of the present invention.
Figure 8:
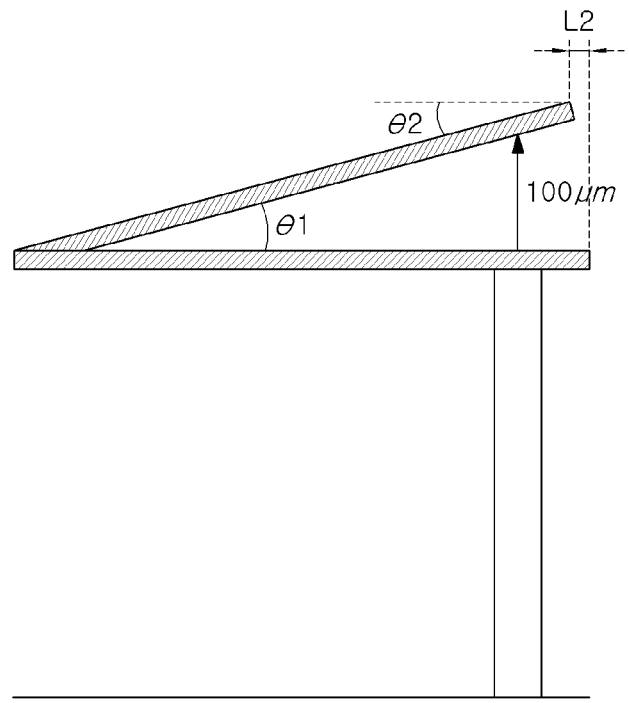

FIGS. 7 and 8 are conceptual diagrams illustrating the movement of the upper plate in the horizontal direction generated by the movement of the lifting pillars in the wafer prober according to the preferred embodiment of the present invention.

Referring to (b) of FIG. 7, in a case where the lifting pillar moves up, the LM guide provided to intersect in the horizontal direction with respect to the vertically arranged upper surface of the lifting pillar slides in the direction toward the center of the triangle by the moving-up height of the lifting pillar, and the moved-up vertical height is retained. At this time, the position of the center of the triangle is retained without change, and only the slope of the upper plate is provided.

On the other hand, referring to (c) of FIG. 7, in a case where the lifting pillar moves down, the LM guide slides outwards of the triangle, that is, in the circumferential direction as much as the moving-down height of the lifting pillar and retains the moving-down vertical height.

At this time, the position of the center of the triangle is retained without change, and only the slope of the upper plate is provided.

In the wafer probing stage according to the present invention, as the spherical socket of the preload adjustment module is engaged with the weight measurement sensor, a structure without a gap with a sphere degree of freedom in the force slope retainment module is provided.

On the other hand, the lock nut of the preload adjustment module with a spherical socket exerts a spherical contact preload by the plate spring for preload, and the preload exerted by the lock nut can be retained by extending the plate spring for preload using the preload adjustment screw.

On the other hand, the slope ($\theta 2$) of one lifting pillar corresponds to the spherical engagement with the spherical surface of the spherical socket, and the horizontal movement amount of the LM guide corresponds to the linear amount of the LM guide.

Referring to FIG. 8, when the lifting module moves up 100 μm, the LM guide is inclined at an angle of θ2 according to the slope of θ1 and is slid toward the center of the triangle by L2.

On the other hand, one embodiment of the wafer probing stage of the wafer prober according to the present invention described above may include three lifting pillars mounted between the lower plate and the upper plate. In particular, it is preferable that each of is configured to move up and down vertically between the upper plate and the lower plate, and the lifting pillars are configured to be driven independently of each other. In addition, it is more preferable that the three lifting pillars are arranged to be uniformly spaced in a triangular shape based on the point of the center of the upper surface of the lower plate. By the above-described configuration, in the wafer probe according to the embodiment, the height and slope of the upper plate can be adjusted according to the height of the lifting pillars.

The wafer probing stage according to the present embodiment may further include a force slope retainment module as described above, a plurality of weight measurement sensors for sensing the weight applied to each lifting pillar, a preload adjustment module between the lower surface of the upper plate and the upper surface of the lifting pillar, and a rotating body module. These are preferably configured in the same way as those described above.

While the present invention has been particularly illustrated and described with reference to exemplary embodiments thereof, it should be understood by the skilled in the art that the invention is not limited to the disclosed embodiments, but various modifications and applications not illustrated in the above description can be made without departing from the spirit of the invention. In addition, differences relating to the modifications and applications should be construed as being included within the scope of the invention as set forth in the appended claims.

In addition, differences relating to the modifications and applications should be construed as being included within the scope of the invention as set forth in the appended claims.

INDUSTRIAL APPLICABILITY

The wafer probing stage according to the present invention can be used as a vertical movement mechanism of a chuck of a wafer prober.

The invention claimed is:

1. A wafer prober comprising a chuck for mounting a wafer and a wafer probing stage for moving or rotating the chuck, the wafer probing stage including:
   a lower plate;
   a plurality of lifting pillars mounted on an upper surface of the lower plate; and
   an upper plate mounted on upper ends of the plurality of lifting pillars,
   wherein the plurality of lifting pillars are located between the upper plate and the lower plate and ends of the lifting pillars are configured to lift up and down in a vertical direction, and
   wherein a height and a slope of the upper plate are adjusted according to heights of the lifting pillars.

2. The wafer prober according to claim 1, wherein the plurality of lifting pillars are configured to be driven independently of each other.

3. The wafer prober according to claim 1, wherein the plurality of lifting pillars are arranged to be uniformly spaced based on a center point of the upper surface of the lower plate.

4. The wafer prober according to claim 1, wherein the wafer probing stage further includes a force slope retainment module that changes only the slope of the upper plate without changing a position of the center of the plurality of lifting pillars.

5. The wafer prober according to claim 4,
   wherein the force slope retainment module is configured with a linear motion (LM) guide,
   wherein the LM guide includes:
   LM guide blocks provided to each of the upper ends of the lifting pillars that abut the lower surface of the upper plate; and
   LM guide rails provided on the lower surface of the upper plate and coupled with each block of the lifting pillars, and
   wherein, when one of the lifting pillars moves in an up-down direction, the LM guide block is moved in the horizontal direction along the LM guide rail, so that only the slope of the upper plate is changed without changing the position of the center of the lifting pillars.

6. The wafer prober according to claim 1, wherein the wafer probing stage further includes a plurality of weight measurement sensors being provided on the respective lifting pillars and sensing weights applied to the respective lifting pillars.

7. The wafer prober according to claim 6, wherein the wafer prober further comprises a preload adjustment module provided between the lower surface of the upper plate and the upper surface of the lifting pillar,
   wherein the weight measurement sensor is mounted on the top or bottom of the preload adjustment module.

8. The wafer prober according to claim 7, wherein the preload adjustment module includes:
   preload adjustment screws provided on the bottom of the block;
   a spherical socket provided on an upper portion of the weight measurement sensor and having an upper surface in a spherical shape;
   lock nuts with a lower surface provided on the upper surface of the spherical socket, the lock nuts being coupled with the preload adjustment screws; and
   a plate spring for preload coupled with the lock nut and an outer circumferential surface of the spherical socket,
   wherein the lock nut and the spherical socket exert a spherical contact preload by a plate spring for preload.

9. The wafer prober according to claim 1, wherein the chuck is arranged on the upper plate of the wafer probing stage.

10. The Wafer prober according to claim 1, wherein the wafer probing stage further includes a rotating body module configured to rotate the lower plate.

11. A wafer prober comprising a chuck for mounting a wafer and a wafer probing stage for moving or rotating the chuck, the wafer probing stage including:
    a lower plate;
    three lifting pillars mounted on an upper surface of the lower plate; and
    an upper plate mounted on upper ends of the three lifting pillars;
    wherein the plurality of the lifting pillars are located between the upper plate and the lower plate and ends of the lifting pillars are configured to lift up and down in a vertical direction, wherein a height and slope of the upper plate are adjusted according to heights of the lifting pillars.

12. The wafer prober according to claim 11, wherein the three lifting pillars are configured to be driven independently of each other.

13. The wafer prober according to claim 11, wherein the three lifting pillars are arranged to be uniformly spaced in a triangular shape based on the point of the center of the upper surface of the lower plate.

14. The wafer prober according to claim 11, wherein the wafer probing stage further includes a force slope retainment module that changes only the slope of the upper plate without changing a position of the center of the three lifting pillars.

15. The wafer prober according to claim 11, wherein the wafer probing stage further includes:
- a plurality of weight measurement sensors being provided on each of the three lifting pillars and sensing a weight applied to each lifting pillar; and
- a preload adjustment module provided between the lower surface of the upper plate and the upper surface of the lifting pillar, wherein the weight measurement sensor is mounted on the top or bottom of the preload adjustment module.

\* \* \* \* \*